(12) United States Patent
Fu et al.

(10) Patent No.: US 10,911,873 B1
(45) Date of Patent: Feb. 2, 2021

(54) METHOD AND APPARATUS FOR MULTIFUNCTION AUDIO SIGNAL CONTROLLER

(71) Applicant: TP-Link Research America Corp., San Jose, CA (US)

(72) Inventors: David Haidong Fu, San Jose, CA (US); Yajun Zhang, San Jose, CA (US)

(73) Assignee: TP-LINK USA CORPORATION, Brea, CA (US)

( * ) Notice: Subject to any disclaimer, the term of this patent is extended or adjusted under 35 U.S.C. 154(b) by 0 days.

(21) Appl. No.: 16/563,881

(22) Filed: Sep. 8, 2019

(51) Int. Cl.
*H03G 3/00* (2006.01)
*H04R 5/04* (2006.01)
*H04R 3/04* (2006.01)

(52) U.S. Cl.
CPC ............... *H04R 5/04* (2013.01); *H04R 3/04* (2013.01); *H04R 2430/01* (2013.01)

(58) Field of Classification Search
CPC .......... H04R 1/10; H04R 1/1025; H04R 5/00; H04R 5/02; H04R 5/033; H04R 25/00; H04R 25/602; H04R 25/40; H04R 25/402; H04R 25/405; H04R 25/407; H04R 25/43; H04R 25/45; H04R 25/453; H04R 25/456; H04R 25/50; H04R 25/55; H04R 25/552; H04R 25/554; H04R 25/556; H04R 25/558; H04R 25/607; H04R 25/502; H04R 25/505; H04R 25/507; H04R 25/35; H04R 25/353; H04R 25/356; H04R 5/04; H04R 3/04; H04R 3/06; H04R 3/08; H04R 3/12; H04R 2430/01; H04S 1/005; G06F 3/16; G06F 3/162; G06F 3/165; G06F 3/167; G06F 16/60; G06F 16/61; G06F 16/632; G06F 16/634; G06F 16/635; G06F 16/636; G06F 16/637; G06F 16/638; G06F 16/639; G06F 16/64; G06F 3/002; G06F 3/0221; G06F 3/0383; G06F 3/03548; G06F 3/0414; G06F 3/04146; G06F 3/041661; G06F 3/041662; G06F 3/045; H03G 5/00; H03G 5/02; H03G 5/025; H03G 7/00
USPC ........ 381/104–110, 119, 120, 123, 333, 334, 381/300–331, 61, 59, 86, 74, 23.1, 26; 700/94; 345/173, 177, 156, 17, 159, 160, 345/158, 157; 725/37; 455/420, 556.1
See application file for complete search history.

(56) References Cited

U.S. PATENT DOCUMENTS 6,782,107 B1 * 8/2004 Gleim .................... H03G 3/301 330/207 A
2018/0018027 A1 * 1/2018 Kowalk .................. B60R 11/00
2018/0335903 A1 * 11/2018 Coffman ................ C08F 232/08

* cited by examiner

*Primary Examiner* — Leshui Zhang

(57) ABSTRACT

An audio device includes an audio output, a single controller, and a processor. The audio output is operable to output at a volume level. The controller is operable to receive a command from a user. The processor is operable to process the received command to provide one of multiple audio control functions that control the audio output. The multiple audio control functions include: a play mode, a pause mode, and a volume change mode. One of the multiple audio control functions is selected in response to comparing a pressing time of the controller with a first predetermined time period. The audio output is operable to output at a volume level during the play mode, to mute during the pause mode, and to the output volume level to be adjusted during the volume change mode.

8 Claims, 3 Drawing Sheets

METHOD AND APPARATUS FOR MULTIFUNCTION AUDIO SIGNAL CONTROLLER

FIELD

The present disclosure relates to audio controlling systems, and more particularly to methods and apparatus for a multifunction audio signal controller.

BACKGROUND

Currently an audio device normally includes multiple controllers located on the surface of the audio device to control/adjust the volume. For example, one configured to adjust (e.g., increase or decrease) the volume of the audio and at least one other configured to play/pause/stop the audio. Additional controllers may be needed to provide additional functions.

Such buttons/keys take lots of space. The controllers can be push buttons, or toggle switches, or keys.

A more compact size of an audio device (e.g., a portable audio device) may be achieved with a more compact device enclosure. With limited surface space on the compact device enclosure, a single controller configured to handle multiple or all audio controlling functions is desirable.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

Introduction

The present disclosure describes how to implement an audio device with a single controller (e.g., a key, a button, or a switch, etc.) having multiple control functions (e.g., volume up/down, and play/pause/stope, etc.).

Method and Apparatus for Multifunction Audio Signal Controller

An audio device includes an audio output, a single controller, and a processor. The audio device is operable to output an audio signal. The audio output volume level is controlled by a controller. The controller is operable to receive a command from a user. The processor is operable to process the received command to provide one of multiple audio control functions that control the audio output. The multiple audio control functions include: a play mode, a pause mode, and a volume change mode. One of the multiple audio control functions is selected in response to comparing a pressing time of the controller with a first predetermined time period. The audio device is operable to output at a volume level during the play mode, to be on mute during the pause mode, and the volume level can be adjusted during the volume change mode.

By tapping the same single key/button/switch, the audio device can be controlled(triggered) to play/pause/stop, the output volume level can be increased or decreased. A CPU/MCU processor may be used for processing input commands received by the single controller to provide the control functions. A software/firmware algorithm may interpret the input commands to the control functions including: play, pause, increase the output volume level, and decrease the output volume level.

Figure 1:
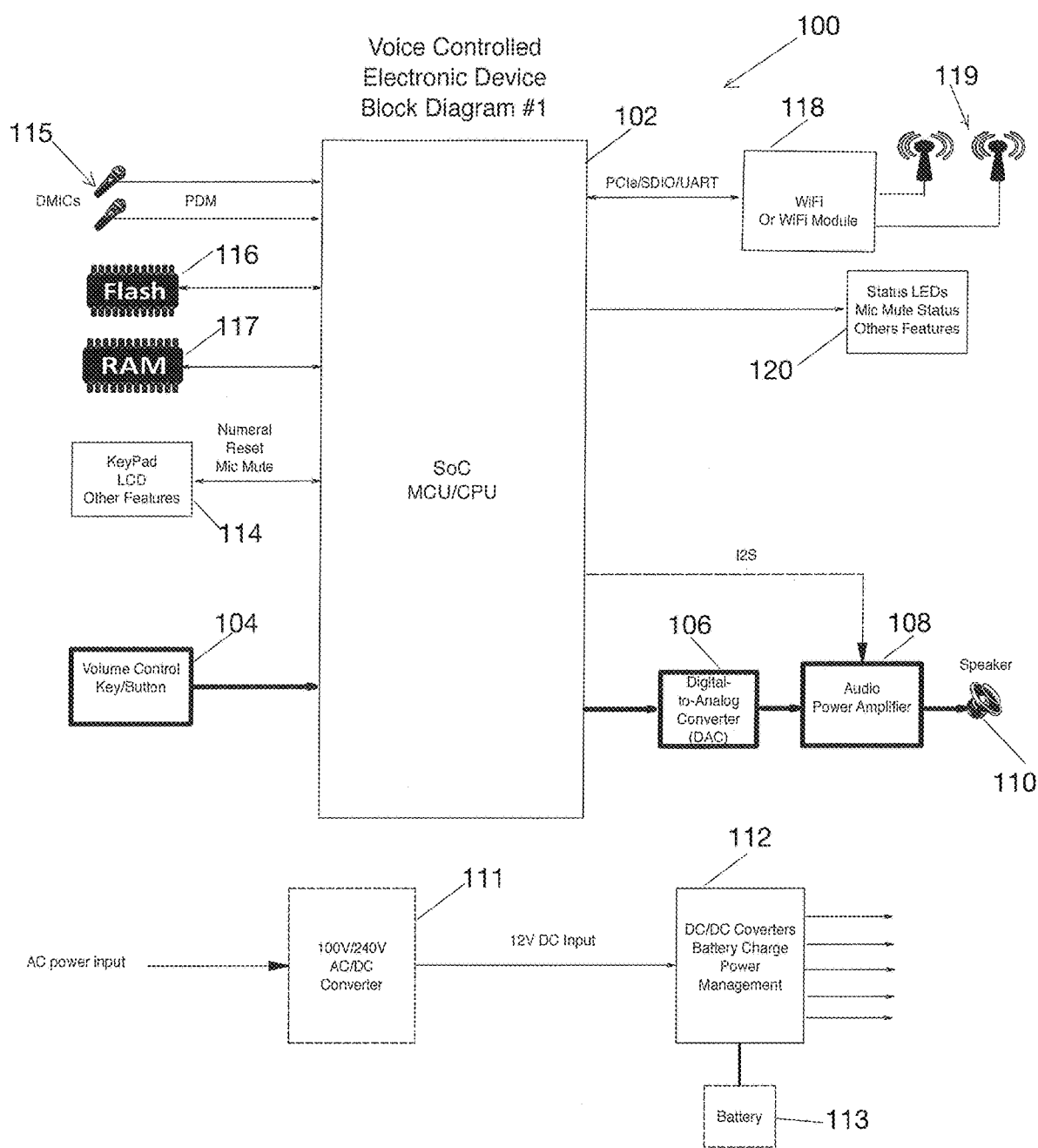
FIG. 1 is a block diagram of an example audio device with a single voice controller according to the principles of the present disclosure.

As shown by FIG. 1, an example audio device 100 includes an MCU/CPU processor 102 with a System on Chip ("SoC") and a Volume Control Counter (VCT) (not shown), a single voice controller 104, an internal/external Digital to Analog Converter ("DAC") 106 having a Gain Control Circuit, an Audio Power Amplifier 108, a speaker/headphone 110 or other audio output terminal. The single voice controller 104 may be a key or a button with multiple volume control functions that are usually achieved by three keys or buttons. The audio device 100 can toggle between play/pause mode by briefly tapping the controller 104. In other words, when pressing the controller 104 for less than a short period of time T1 (T1 can be a predefined value, 100 ms, 200 ms, or 300 ms, etc.), the audio device 100 can be changed from play mode to pause mode or vice versa. Further, when pressing the controller 104 for a time that is longer than the predetermined time T1, the audio device 100 will enter into a volume change mode. Or the controller 104 enters into a volume change mode so the volume can be adjusted?

The Volume Control Counter includes a parameter "n" that represents the level of the output audio signal strength. The bigger the "n" value is, the louder the audio output is. The value of "n" is between 0 and a predetermined number N. When n=0, the audio device 100 is on mute and when n=N, the audio device 100 outputs at its maximum volume.

When the audio device 100 is in the volume change mode (i.e., when pressing the controller 104 for a time that is longer than the predetermined time T1), the Volume Control Counter starts to count down by decreasing value of "n" by one unit of increment at a time. The audio device 100 is configured to hold the volume at each value of "n" for a second time period T2 (T2 can be a predefined value, 100 ms, 200 ms, or 300 ms, etc.) Therefore, the process of decreasing the volume of the audio device 100 is slowed down by introducing the time period of T2. The audio device 100 keeps decreasing when the control key 104 is pressed continuously for more than the time period of T2. When the volume is at a desired level, the controller 104 can be released and the volume remains at the level until the controller 104 is pressed again.

If the controller 104 remains being pressed when n reaches 0, n starts to increase by one incremental unit at a time and holds each volume level for a third time period T3 (T3 can be a predefined value, 100 ms, 200 ms, or 300 ms, etc.). Likewise, the process of increasing the volume of the audio device 100 is slowed down by introducing the time period of T3. The volume level of the audio device 100 keeps increasing when the controller 104 is continuously pressed for more than the time period of T3. When the volume level reaches a desired value, the controller 104 can be released and the volume level remains at the level until the controller 104 is pressed again.

Similarly, if the controller 104 remains being pressed when n reaches N, n starts to decrease one incremental unit at a time and holds each level for the second time period T2.

The second time period T2 and the third time period T3 are not necessarily defined to be the same value. Accordingly, a single audio signal controller 104 with multifunction for an audio device is achieved.

Alternatively, when the controller 104 is continuously pressed, the volume can be adjusted to increase until the volume reaches a predetermined maximum volume and then to decrease.

The Digital to Analog Converter 106 converts the digital format of audio signals to the analog signals that can be heard by human beings. The Gain Control Circuit controls the audio signal strength. The Gain Control Circuit is often integrated within the DAC. As such, the DAC may include the function of the Gain Control Circuit. The Audio Power Amplifier 108 amplifies the audio signal from the analog signals output by the DAC 106 to a level that is high enough for driving the speaker/headphone 108.

The audio device 100 further includes an AC/DC converter 111, which converts a 100 volt or 240-volt AC power input to a 12-volt DC output, which supplies a DC/DC converters/battery charge/power management 112. The DC/DC converters/battery charge/power management 112 converts the 12-volt DC power into various DC voltages to provide DC power for charging the battery needed by the device 100. Additionally, the DC/DC converters/battery charge/power management 112 may also include an alternative DC power supply from a battery 113.

Additionally, and/or alternatively, the audio device 100 may include a keypad and an LCD display 114 to interface with a user. By using the keypad and the LCD display 114, the user can input numeral values to control the volume, reset the audio device 100, or mute/unmute microphones 115 of the audio device 100.

Further, the audio device may include a flash memory 116 that retains data with power supply turned on or off, and a RAM memory 117 that stores and allows fast access to data when the power is on.

The audio device 100 may include a Wi-Fi module 118 operable to access Wi-Fi networks. The Wi-Fi module 118 may further include an antenna 119 for receiving from or transmitting to Wi-Fi networks.

The Wi-Fi module 118 can interact with the audio device 100 through a PCIe (peripheral component interconnect express), an SDIO (Secure Digital Input Output), or a UART (Universal Asynchronous Receiver/Transmitter) interface.

The audio device 100 may include status LEDs 120, which can be used to indicate mute status of the microphones 115 or other features.

Figure 2:
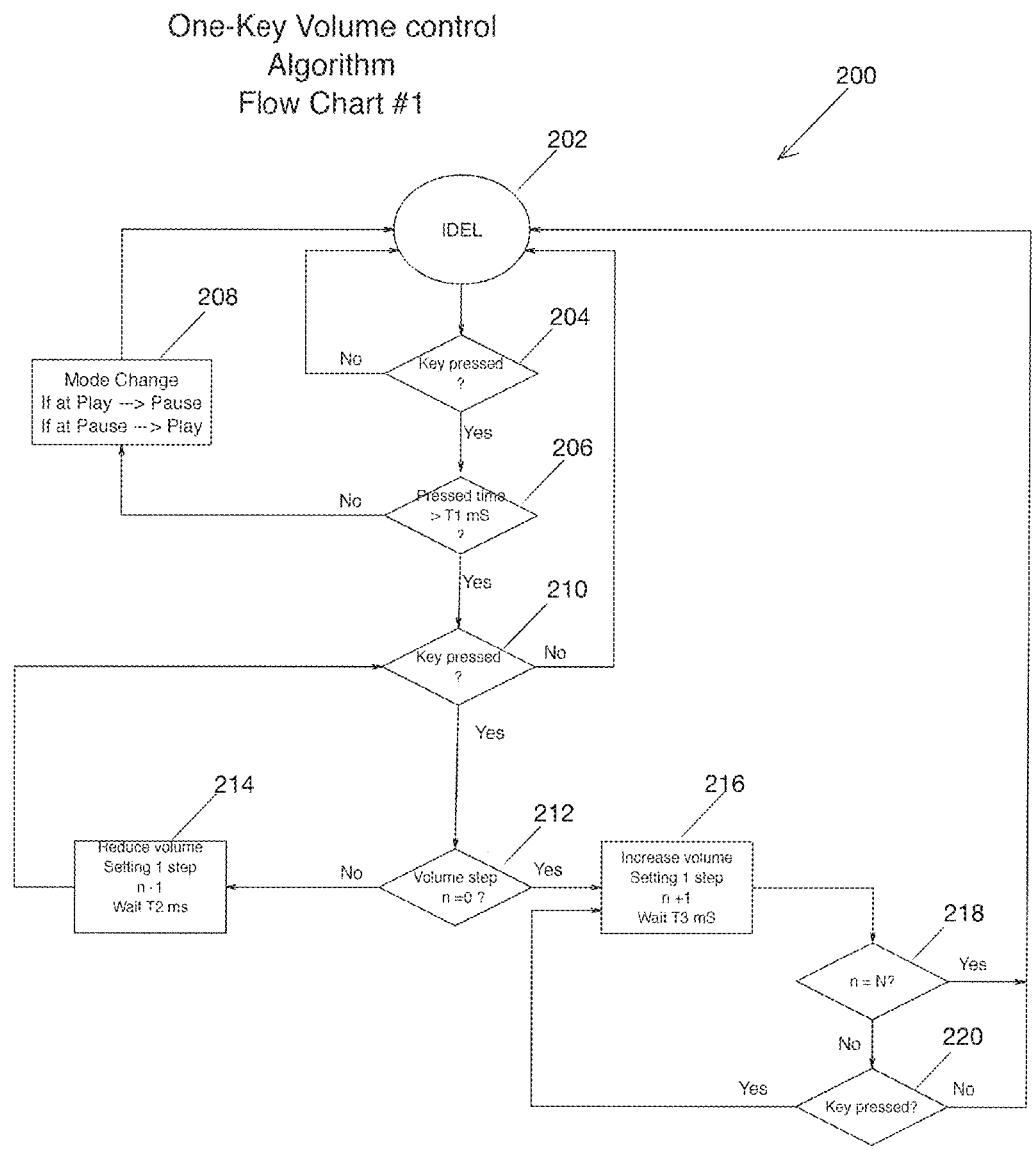
FIG. 2 is a flowchart showing an example method using a single voice controller according to the principles of the present disclosure.

In FIG. 2, an example implementation process 200 of the audio device 100 is shown. The process begins at 202 when the processor 102 of the audio device 100 is at an "Idle" state. At 204, the audio device 100 checks whether the controller 104 is pressed.

If No, device 100 stays at the "Idle" state. If Yes, at 206, the processor 102 checks if the pressing time is greater than the short period of time T1 (T1 can be a predefined value, 200 ms, 300 ms, etc.).

If No, at 208, the processor 102 changes the audio device 100 from a "play" mode to a "pause" mode or vice versa. In other words, the processor 102 changes the audio device 100 to the "pause" mode if the audio device 100 is previously at the "play" mode when being tapped, or changes the audio device 100 to the "play" mode if the audio device 100 is previously at the "pause" mode when being tapped.

If Yes, at 210, the processor 102 changes the audio device 100 to a volume change mode and checks whether the controller 104 is still being pressed.

If No, the device 100 goes back to the "Idle" state and starts over.

If Yes, at 212, the processor 102 checks if the parameter "n" of the Volume Control Counter equals 0, which means that the volume level of the audio output signal reaches its minimum and the audio device 100 is on mute.

If No, at 214, the processor 102 reduces the volume level of the audio device 100 by one incremental unit at a time and the Volume Control Counter decreases "n" by one at a time and holds the volume level of the audio device 100 and at "n" for the second predetermined time period T2 (T2 can be a predefined value, 100 ms, 200 ms, etc.) After the time period of T2, the audio device 100 goes to a state 210, and checks whether the controller 104 remains pressed. If Yes, at 214, the volume level of the audio device 100 keeps decreasing.

When the controller 104 remains pressed and the parameter "n" of the Volume Control Counter reaches 0, at 216, the processor 102 increases the volume of the audio device 100 by one incremental unit at a time and the Volume Control Counter increases "n" by one at a time and keeps the volume level of the audio device 100 at "n" for the third time period T3 (T3 can be a predefined value, 100 ms, 200 ms, etc.).

At 218, the processor 102 checks if the parameter "n" of the Volume Control Counter reaches the predetermined maximum value N, which means that the level of the output volume of the device 100 reaches its maximum.

If Yes, the audio device 100 goes back to the "Idle" state and starts over.

If No, at 220, the processor 102 checks if the controller 104 remains pressed.

If No, the audio device 100 goes back to "Idle" state and starts over.

If Yes, the audio device 100 goes back to 216, the volume of the audio device 100 increases by one incremental unit while the value "n" of the Volume Control Counter increases by one, and each keeps the value for the third time period T3.

Figure 3:
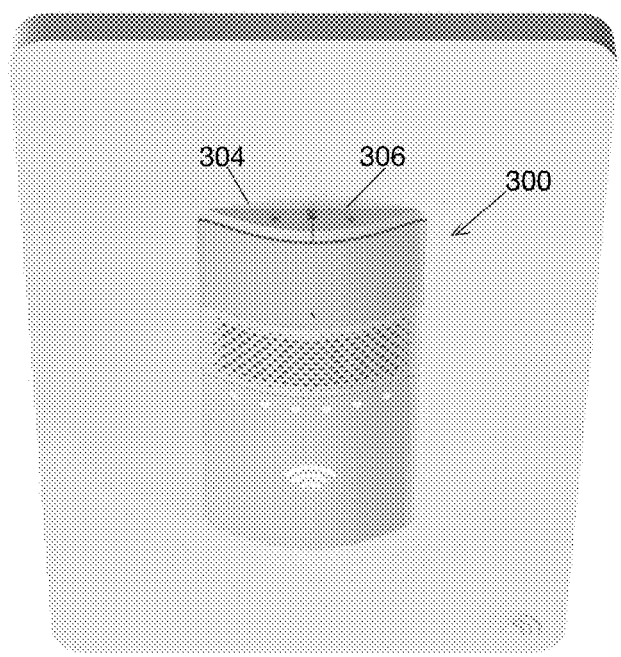
FIG. 3 is a perspective view showing an example audio device implementation according to the principles of the present disclosure.

In FIG. 3, a voice control wall-switch 300 shows an example audio device implementation. A single volume control button 304 is operable to play/pause/adjust the volume. A microphone control button 306 is operable to receive audio signals.

CONCLUSION

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A. The term subset does not necessarily require a proper subset. In other words, a first subset of a first set may be coextensive with (equal to) the first set.

In this application, including the definitions below, the term "module" or the term "controller" may be replaced with the term "circuit." The term "module" may refer to, be part of, or include processor hardware (shared, dedicated, or group) that executes code and memory hardware (shared, dedicated, or group) that stores code executed by the processor hardware.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2016 (also known as the WIFI wireless networking standard) and IEEE Standard 802.3-2015 (also known as the ETHERNET wired networking standard). Examples of a WPAN are the BLUETOOTH wireless networking standard from the Bluetooth Special Interest Group, IEEE Standard 802.15.4, or cellular networks 3G, 4G, 5G and LTE.

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. An audio device comprising:
   an audio output having a volume level;
   a single button controller operable to receive a pressing command from a user; and
   a processor operable to process the received pressing command to control the audio output by comparing a continuous pressing time of the received pressing command with a first predetermined time period;
   in response to the continuous pressing time being less than the first predetermined time period, toggling the audio device between a play mode and a pause mode by using the single-button controller;
   in response to the continuous pressing time being longer than the first predetermined time period, entering the audio device into a volume change mode, and
   wherein the audio output is operable to: output at the volume level during the play mode, mute during the pause mode and adjust the volume level by using the single-button controller during the volume change mode.

2. The audio device of claim 1, wherein the processor further comprises a volume control counter having a parameter n that represents the volume level, and wherein n is between 0 and a predetermined number N.

3. The audio device of claim 2, wherein:
   during the volume change mode and when n is greater than 0 and less than or equal to the predetermined number N, the volume control counter counts down by decreasing the parameter n one at a time and holds the parameter n at each value for a second predetermined time, and
   during the volume change mode and when n equals 0, the volume control counter counts up by increasing the parameter n one at a time and holds the parameter n at each value for the second predetermined time.

4. The audio device of claim 3, wherein the single button controller is operable to release in response to the volume level being desired by the user.

5. A method for providing multiple audio control functions for an audio device, the method comprising:
   outputting at a volume level of the audio device;
   receiving a pressing command by a single button controller from a user; and
   processing the received pressing command by a processor to control the volume level by comparing a continuous pressing time of the received pressing command with a first predetermined time period,
   in response to the continuous pressing time being less than the first predetermined time period, toggling the audio device between a play mode and a pause mode by using the single-button controller;
   in response to the continuous pressing time being longer than the first predetermined time period, entering the audio device into a volume change mode,
   wherein the audio output is operable to: output at the volume level during the play mode, mute during the pause mode, and adjust the volume level by using the single-button controller during the volume change mode.

6. The method of claim 5, further comprising:
   providing a volume control counter parameter n that represents the volume level, and wherein n is between 0 and a predetermined number N.

7. The method of claim 6, further comprising:
   during the volume change mode and when the volume control counter parameter n is greater than 0 and less than or equal to the predetermined number N, decreasing the parameter n one at a time and holding the volume control counter parameter n at each value for a second predetermined time, and
   during the volume change mode and when the volume control counter parameter n is equal to 0, increasing the volume control counter parameter n one at a time and holding the volume control counter parameter n at each value for the second predetermined time.

8. The method of claim 7, further comprising:
   releasing the single button controller in response to the volume level being desired by the user.

* * * * *